United States Patent
Lei et al.

(10) Patent No.: US 10,099,574 B2
(45) Date of Patent: Oct. 16, 2018

(54) VEHICLE POWER MODULE ASSEMBLIES

(71) Applicant: Ford Global Technologies, LLC, Dearborn, MI (US)

(72) Inventors: Guangyin Lei, Dearborn Heights, MI (US); Chingchi Chen, Ann Arbor, MI (US); Ke Zou, Canton, MI (US); Michael W. Degner, Novi, MI (US)

(73) Assignee: Ford Global Technologies, LLC, Dearborn, MI (US)

( * ) Notice: Subject to any disclaimer, the term of this patent is extended or adjusted under 35 U.S.C. 154(b) by 854 days.

(21) Appl. No.: 14/687,153

(22) Filed: Apr. 15, 2015

(65) Prior Publication Data

US 2016/0303995 A1    Oct. 20, 2016

(51) Int. Cl.
| | |
|---|---|
| *H02B 1/01* | (2006.01) |
| *B60L 15/00* | (2006.01) |
| *H01L 23/495* | (2006.01) |
| *B60K 1/04* | (2006.01) |
| *H02M 7/00* | (2006.01) |

(52) U.S. Cl.
CPC ............. *B60L 15/007* (2013.01); *B60K 1/04* (2013.01); *H01L 23/49524* (2013.01); *H01L 23/49575* (2013.01); *H01L 23/49537* (2013.01); *H02M 7/003* (2013.01); *Y02T 10/645* (2013.01); *Y10S 903/952* (2013.01)

(58) Field of Classification Search
CPC ... B60L 15/007; B60K 1/04; H01L 23/49524; H01L 23/49575; H01L 23/49537; H02M 7/003; Y02T 10/645; Y10S 903/952

USPC ........................................................ 361/825
See application file for complete search history.

(56) References Cited

U.S. PATENT DOCUMENTS

| | | | |
|---|---|---|---|
| 7,034,345 B2 | 4/2006 | Chang et al. | |
| 7,760,503 B2 | 7/2010 | Aoki et al. | |
| 8,057,239 B2 | 11/2011 | Campbell et al. | |
| 8,519,561 B2 | 8/2013 | Azuma et al. | |
| 8,804,340 B2 | 8/2014 | Hauenstein | |
| 9,373,567 B2 * | 6/2016 | Tan ..................... | H01L 23/4952 |
| 2004/0227231 A1 * | 11/2004 | Maly .................... | H01L 25/072 |
| | | | 257/724 |
| 2006/0096299 A1 * | 5/2006 | Mamitsu ............... | H01L 23/473 |
| | | | 62/3.2 |

(Continued)

*Primary Examiner* — Hung S Bui
(74) *Attorney, Agent, or Firm* — David B. Kelley; Brooks Kushman P.C.

(57) ABSTRACT

A vehicle power stage assembly is disclosed which may include a power stage housing, a power stage supported by the housing, and a pair of stacked DC leadframes. The pair of stacked DC leadframes are of opposite polarity and spaced apart from one another. Each of the DC leadframes may extend from the power stage and each has distal and proximal ends. The spacing between the leadframes may be such that parasitic inductances associated with current flowing through each of the leadframes at least partially cancel one another. Each of the leadframes may define a first and second side surface opposite one another. The first side surfaces may be coplanar and the second side surfaces may be coplanar. A distance between the spaced apart pair of DC leadframes may be based on a preselected amount of current and a material of the DC leadframes.

17 Claims, 6 Drawing Sheets

(56) References Cited

U.S. PATENT DOCUMENTS

| | | |
|---|---|---|
| 2012/0235290 A1 | 9/2012 | Morelle et al. |
| 2013/0020694 A1 | 1/2013 | Liang et al. |
| 2013/0119525 A1* | 5/2013 | Tsuyuno ................ B60L 1/003 257/675 |

* cited by examiner

VEHICLE POWER MODULE ASSEMBLIES

TECHNICAL FIELD

The present disclosure relates to power module assemblies for automotive vehicles.

BACKGROUND

Electrified vehicles such as battery-electric vehicles (BEVs), plug-in hybrid-electric vehicles (PHEVs), mild hybrid-electric vehicles (MHEVs), or full hybrid-electric vehicles (FHEVs) contain an energy storage device, such as a high voltage (HV) battery. A power inverter can be electrically connected between the battery and any electric machines to convert direct current from the battery to alternating current for the electric machines. The power inverter may also convert alternating current from the electric machines to direct current for the battery.

SUMMARY

A vehicle power stage assembly includes a power stage housing, a power stage supported by the housing, and a pair of stacked DC leadframes. The pair of stacked DC leadframes are of opposite polarity and spaced apart from one another. Each of the DC leadframes extends from the power stage and each has distal and proximal ends. The spacing between the leadframes is such that parasitic inductances associated with current flowing through each of the leadframes at least partially cancel one another. Each of the leadframes may further define a connector tab configured to electrically connect to a capacitor module. The leadframes may be arranged such that the connector tabs extend in opposite directions from one another and outer surfaces of the tabs are substantially coplanar. The leadframes may be spaced apart a distance falling within a range of 0.25 millimeters to 1.0 millimeters. Each of the leadframes may define a first and second side surface opposite one another. The first side surfaces may be coplanar and the second side surfaces may be coplanar. The leadframes may be oriented parallel to one another. A distance between the spaced apart pair of DC leadframes may be based on a preselected amount of current and a material of the DC leadframes.

A vehicle power module assembly includes a frame and a power stage. The frame defines a stage cavity and a first slot open to the cavity. The power stage is disposed within the cavity and has a pair of DC leadframes extending through the first slot. The first slot is defined such that distal and proximal ends of one of the leadframes are equally spaced apart relative to corresponding distal and proximal ends of the other of the leadframes. The frame may further define a second slot open to the cavity and the power stage may further have an AC leadframe extending through the second slot. The frame may further define a signal pin slot open to the cavity. The power stage may further have at least one set of signal pins extending through the signal pin slot. The slots may be arranged relative to one another such that the DC leadframes and pins each extend from a different side of the power stage. The DC leadframes may be spaced apart a distance such that parasitic inductances associated with current flowing through each of the leadframes at least partially cancel one another. The DC leadframes may be spaced apart a distance falling within a range of 0.1 millimeters to 20.0 millimeters. The assembly may also include a capacitor module having a pair of DC leadframe receiving connectors arranged with the frame such that the connectors are spaced apart from one another at a distance equal to the spacing between the DC leadframes.

A vehicle power module assembly includes a frame and a power stage. The frame defines a cavity and first and second DC slots spaced apart from one another. The power stage is disposed within the cavity and has a pair of DC leadframes of opposite polarity. One of the DC leadframes extends through one of the slots and the other of the DC leadframes extends through the other of the slots. The stage and slots are arranged with one another to position proximal and distal ends of one of the DC leadframes at equal spacings from proximal and distal ends of the other of the DC leadframes. Each of the DC leadframes may further have a tab extending from the distal end and away from other of the tabs and outer surfaces defined by each of the tabs may be coplanar. The DC leadframes may be spaced to reduce stray inductances associated with the DC leadframes. The frame may further define an AC slot arranged with the power stage such that the AC slot is on a side of the frame which does not include the DC slots. The frame may further define a pair of signal pin slots arranged with the power stage such that the signal pin slots are on a side of the frame which does not include the DC slots or the AC slot.

DETAILED DESCRIPTION

Embodiments of the present disclosure are described herein. It is to be understood, however, that the disclosed embodiments are merely examples and other embodiments can take various and alternative forms. The figures are not necessarily to scale; some features could be exaggerated or minimized to show details of particular components. Therefore, specific structural and functional details disclosed herein are not to be interpreted as limiting, but merely as a representative basis for teaching one skilled in the art to variously employ the present disclosure. As those of ordinary skill in the art will understand, various features illustrated and described with reference to any one of the figures can be combined with features illustrated in one or more other figures to produce embodiments that are not explicitly illustrated or described. The combinations of features illustrated provide representative embodiments for typical applications. Various combinations and modifications of the features consistent with the teachings of this disclosure, however, could be desired for particular applications or implementations.

Figure 1:
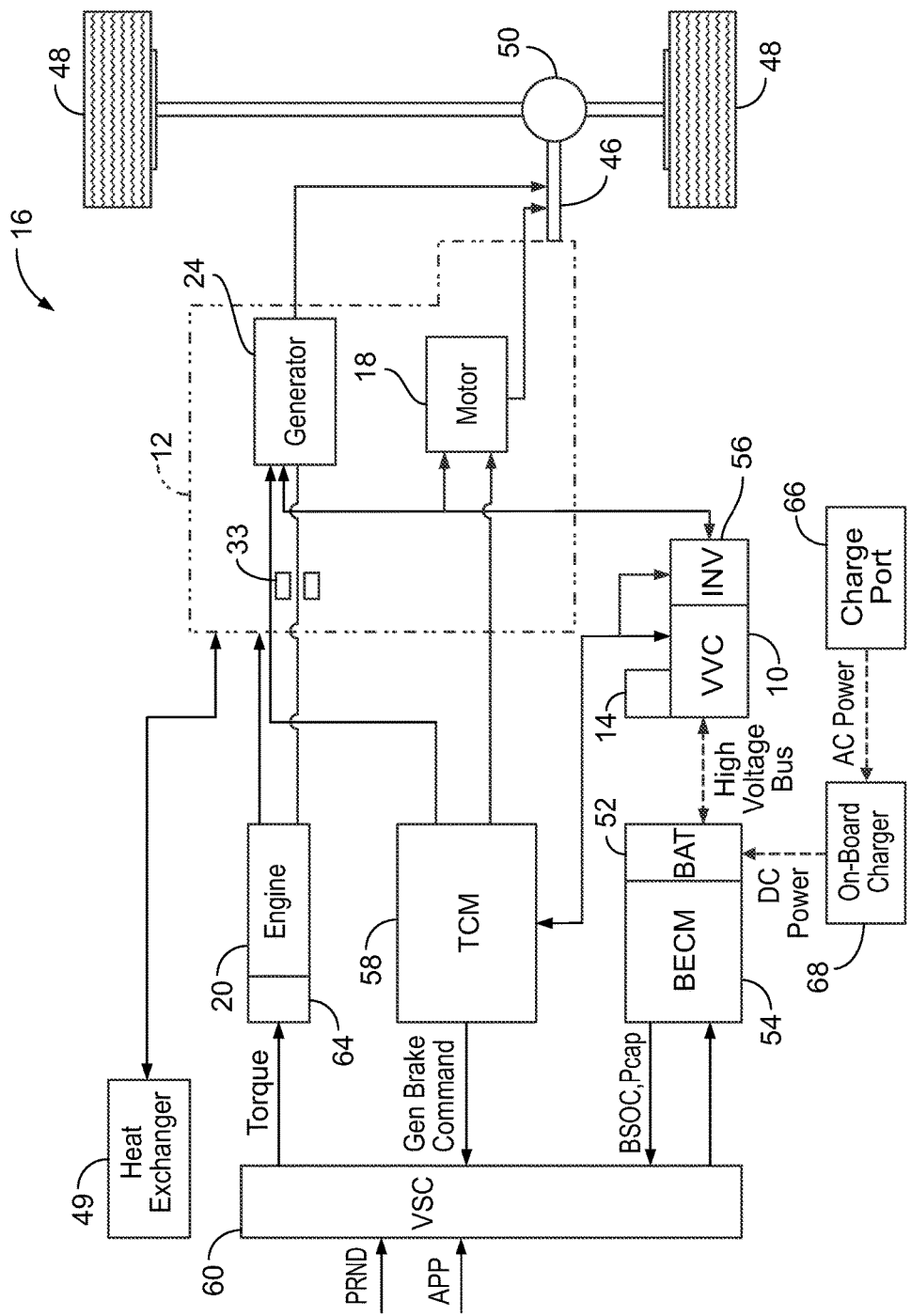
FIG. 1 is a schematic diagram of an example hybrid vehicle.

An example of a PHEV is depicted in FIG. 1, referred to generally as a vehicle 16 herein. The vehicle 16 may include a transmission 12 and is an example of an electric vehicle propelled by an electric machine 18 with assistance from an internal combustion engine 20. The vehicle 16 may be connectable to an external power grid. The electric machine 18 may be an AC electric motor depicted as a motor 18 in FIG. 1. The electric machine 18 receives electrical power and provides torque for vehicle propulsion. The electric machine 18 may also function as a generator for converting mechanical power into electrical power through regenerative braking.

The transmission 12 may be a power-split configuration. The transmission 12 may include the first electric machine 18 and a second electric machine 24. The second electric machine 24 may be an AC electric motor depicted as a generator 24 in FIG. 1. Similar to the first electric machine 18, the second electric machine 24 may receive electrical power and provide output torque. The second electric machine 24 may also operate as a generator for converting mechanical power into electrical power and optimizing power flow through the transmission 12. In other embodiments, the transmission may not have a power-split configuration.

The transmission 12 may include a planetary gear unit (not shown) and may operate as a continuously variable transmission and without any fixed or step ratios. The transmission 12 may also include a one-way clutch (O.W.C.) and a generator brake 33. The O.W.C. may be coupled to an output shaft of the engine 20 to control a direction of rotation of the output shaft. The O.W.C. may prevent the transmission 12 from back-driving the engine 20. The generator brake 33 may be coupled to an output shaft of the second electric machine 24. The generator brake 33 may be activated to "brake" or prevent rotation of the output shaft of the second electric machine 24 and of the sun gear 28. Alternatively, the O.W.C. and the generator brake 33 may be replaced by implementing control strategies for the engine 20 and the second electric machine 24. The transmission 12 may be connected to a driveshaft 46. The driveshaft 46 may be coupled to a pair of drive wheels 48 through a differential 50. An output gear (not shown) of the transmission may assist in transferring torque between the transmission 12 and the drive wheels 48. The transmission 12 may also be in communication with a heat exchanger 49 or an automatic transmission fluid cooler (not shown) for cooling the transmission fluid.

The vehicle 16 includes an energy storage device, such as a traction battery 52 for storing electrical energy. The battery 52 may be a HV battery capable of outputting electrical power to operate the first electric machine 18 and the second electric machine 24 as further described below. The battery 52 may also receive electrical power from the first electric machine 18 and the second electric machine 24 when they are operating as generators. The battery 52 may be a battery pack made up of several battery modules (not shown), where each battery module contains a plurality of battery cells (not shown). Other embodiments of the vehicle 16 contemplate alternative types of energy storage devices, such as capacitors and fuel cells (not shown) that may supplement or replace the battery 52.

A high voltage bus may electrically connect the battery 52 to the first electric machine 18 and to the second electric machine 24. For example, the vehicle 16 may include a battery energy control module (BECM) 54 for controlling the battery 52. The BECM 54 may receive input indicative of certain vehicle conditions and battery conditions, such as battery temperature, voltage, and current. The BECM 54 may calculate and estimate parameters of the battery 52, such as a battery state of charge (BSOC) and a battery power capability (Pcap). The BECM 54 may provide output that is indicative of the BSOC and Pcap to other vehicle systems and controllers.

The vehicle 16 may include a DC-DC converter or variable voltage converter (VVC) 10 and an inverter 56. The VVC 10 and the inverter 56 may be electrically connected between the battery 52 and the first electric machine 18 and the second electric machine 24. The VVC 10 may "boost" or increase a voltage potential of electrical power provided by the battery 52. The VVC 10 may also "buck" or decrease voltage potential of the electrical power provided to the battery 52. The inverter 56 may invert DC power supplied by the battery 52 via the VVC 10 to AC power for operating each of the electric machines 18 and 24. The inverter 56 may also rectify AC power provided by each of the electric machines 18 and 24 to DC for charging the battery 52. In other examples, the transmission 12 may operate with multiple inverters, such as one inverter associated with each of the electric machine 18 and 24. The VVC 10 includes an inductor assembly 14 (further described in relation to FIG. 2).

The transmission 12 is shown in communication with a transmission control module (TCM) 58 for controlling the electric machines 18 and 24, the VVC 10, and the inverter 56. The TCM 58 may be configured to monitor conditions of each of the electric machines 18 and 24 such as position, speed, and power consumption. The TCM 58 may also monitor electrical parameters (e.g., voltage and current) at various locations within the VVC 10 and the inverter 56. The TCM 58 provides output signals corresponding to this information for other vehicle systems to utilize.

The vehicle 16 may include a vehicle system controller (VSC) 60 that communicates with other vehicle systems and controllers for coordinating operations thereof. Although shown as a single controller, it is contemplated that the VSC 60 may include multiple controllers to control multiple vehicle systems and components according to an overall vehicle control logic or software.

The vehicle controllers, such as the VSC 60 and the TCM 58, may include various configurations of microprocessors, ASICs, ICs, memory (e.g., FLASH, ROM, RAM, EPROM and/or EEPROM), and software code to cooperate with one another to perform vehicle operations. The controllers may also include predetermined data, or "look up tables," which are accessible from the memory and may be based on calculations and test data. This predetermined data may be utilized by the controllers to facilitate control of the vehicle operations. The VSC 60 may communicate with other vehicle systems and controllers (e.g., the BECM 54 and the TCM 58) over one or more wired or wireless connections using bus protocols such as CAN and LIN. The VSC 60 may receive input (PRND) that represents a current position of the transmission 12 (e.g., park, reverse, neutral or drive). The VSC 60 may also receive input (APP) that represents an accelerator pedal position. The VSC 60 may provide outputs representative of a desired wheel torque, desired engine speed, and a generator brake command to the TCM 58; and contactor control to the BECM 54.

The vehicle 16 may include an engine control module (ECM) 64 for controlling the engine 20. The VSC 60 provides output, such as desired engine torque, to the ECM 64 that may be based on a number of input signals including APP and may correspond to a driver's request for vehicle propulsion.

The battery 52 may periodically receive AC energy from an external power supply or grid via a charge port 66. The vehicle 16 may also include an on-board charger 68 which receives the AC energy from the charge port 66. The charger 68 may include AC/DC conversion capability to convert the received AC energy into DC energy suitable for charging the battery 52 during a recharge operation. Although illustrated and described in the context of a PHEV, it is contemplated that the inverter 56 may be implemented with other types of electrified vehicles, such as a FHEV or a BEV.

Figure 2:
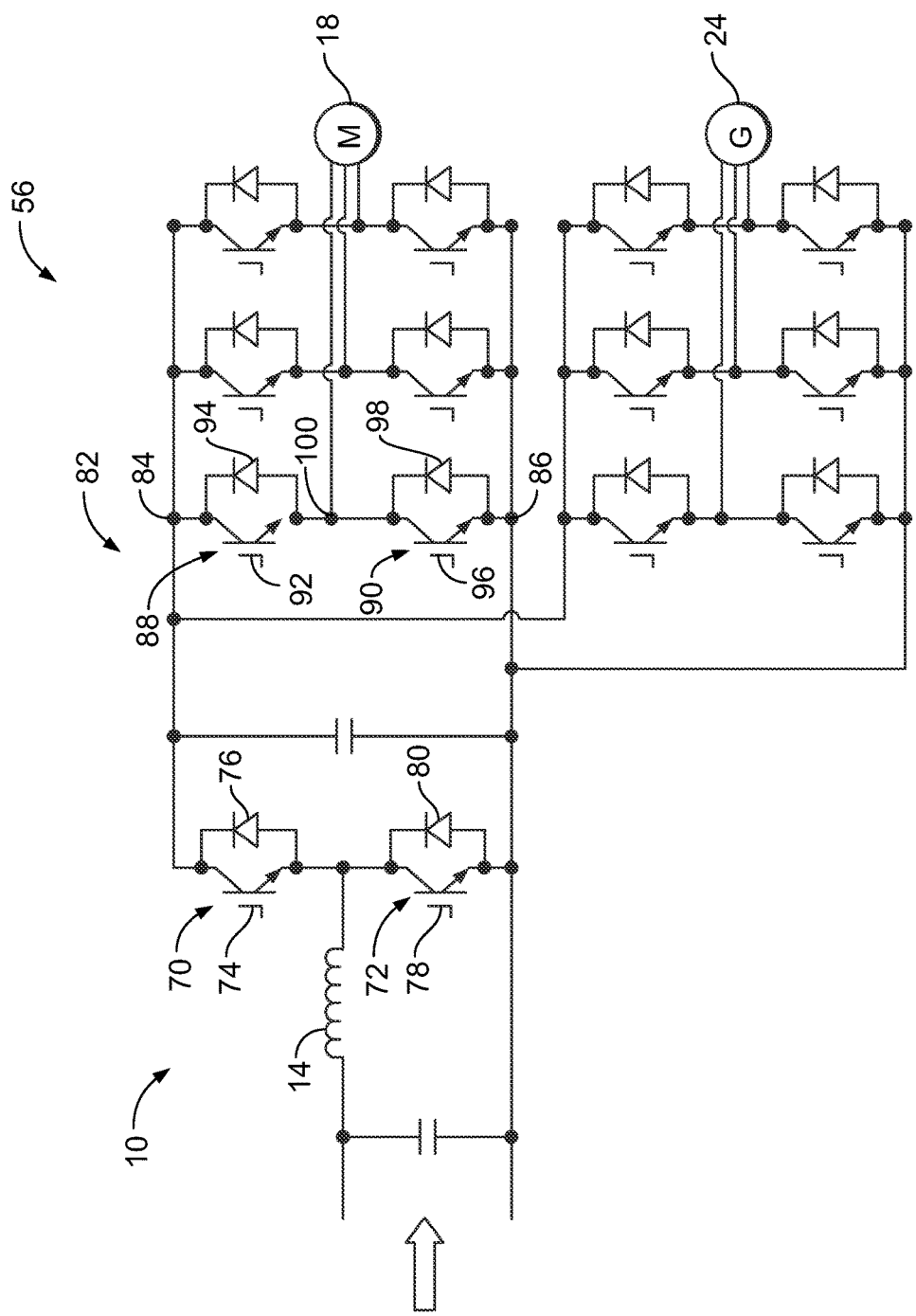
FIG. 2 is a schematic diagram of a variable voltage converter and power inverter.

Referring to FIG. 2, an example of an electrical schematic of the VVC 10 and the inverter 56 is shown. The VVC 10 may include a first switching unit 70 and a second switching unit 72 for boosting the input voltage (V_bat) to provide output voltage (V_dc). The first switching unit 70 is shown with a first transistor 74 connected in parallel to a first diode 76 and with their polarities switched (referred to as anti-parallel herein). The second switching unit 72 is shown with a second transistor 78 connected anti-parallel to a second diode 80. Each of the transistors 74 and 78 may be a type of controllable switch (e.g., an insulated gate bipolar transistor (IGBT) or field-effect transistor (FET)). Additionally, each of the transistors 74 and 78 may be individually controlled by the TCM 58. The inductor assembly 14 is depicted as an input inductor that is connected in series between the battery 52 and the switching units 70 and 72. The inductor assembly 14 may generate magnetic flux when a current is supplied. When the current flowing through the inductor assembly 14 changes, a time-varying magnetic field is created and a voltage is induced. Other embodiments of the VVC 10 may include alternative circuit configurations (e.g., more than two switches).

The inverter 56 may include a plurality of half-bridges 82 stacked in an assembly. Each of the half-bridges 82 may be packaged as a power stage. In the illustrated example, the inverter 56 includes six half-bridges (though FIG. 2 labels only one complete half-bridge 82), three for the motor 18 and three for the generator 24. Each of the half-bridges 82 may include a positive DC lead 84 that is coupled to a positive DC node from the battery 52 and a negative DC lead 86 that is coupled to a negative DC node from the battery 52. Each of the half-bridges 82 may also include a first switching unit 88 and a second switching unit 90. The first switching unit 88 includes a first transistor 92 connected in parallel to a first diode 94. The second switching unit 90 includes a second transistor 96 connected in parallel to a second diode 98. The first transistor 92 and the second transistors 96 may be IGBTs or FETs. The first switching unit 88 and the second switching unit 90 of each of the half-bridges 82 converts the DC power of the battery 52 into a single phase AC output at the AC lead 100. Each of the AC leads 100 is electrically connected to the motor 18 or generator 24. In this example, three of the AC leads 100 are electrically connected to the motor 18 and the other three AC leads 100 are electrically connected to the generator 24.

During operation of power modules, stray inductance may play a role in determining a voltage spike of a semiconductor device during a switching event. A low stray inductance power module design may be desired to promote low voltage spikes and low switching losses.

Figure 3:
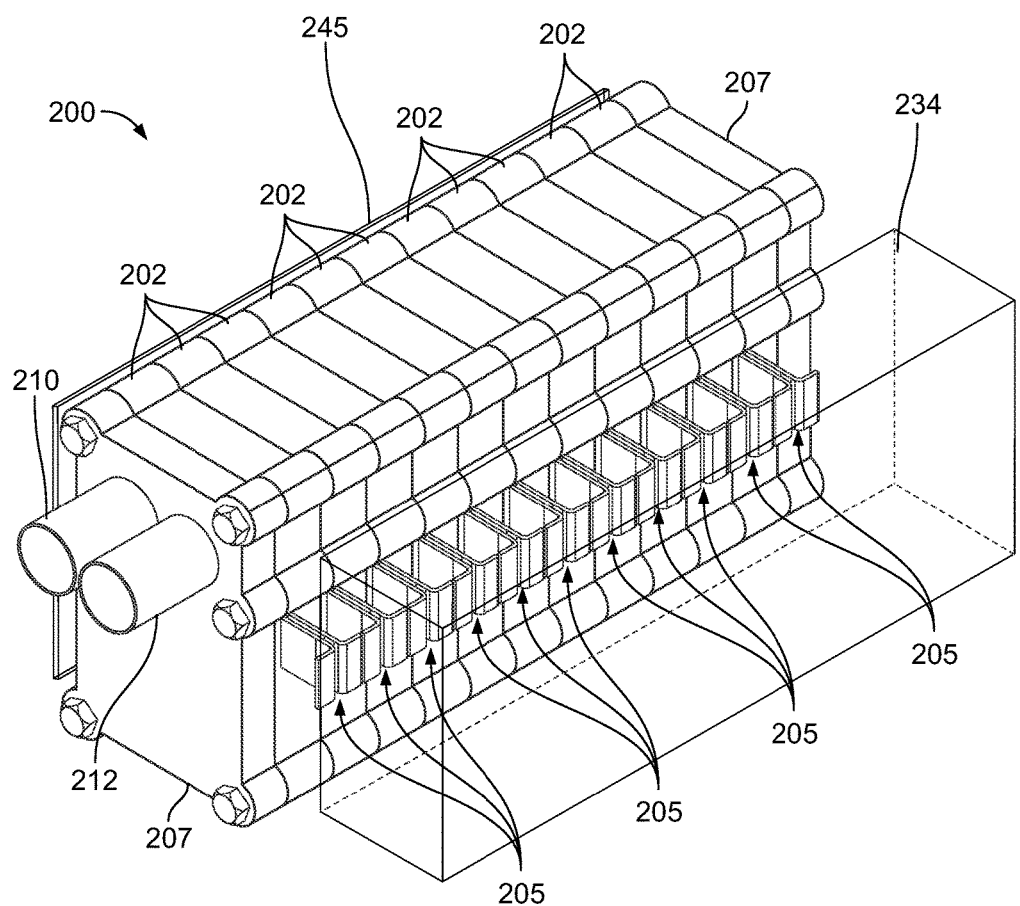
FIG. 3 is a perspective view of an example of a portion of a power module assembly showing a capacitor module in phantom.
Figure 4:
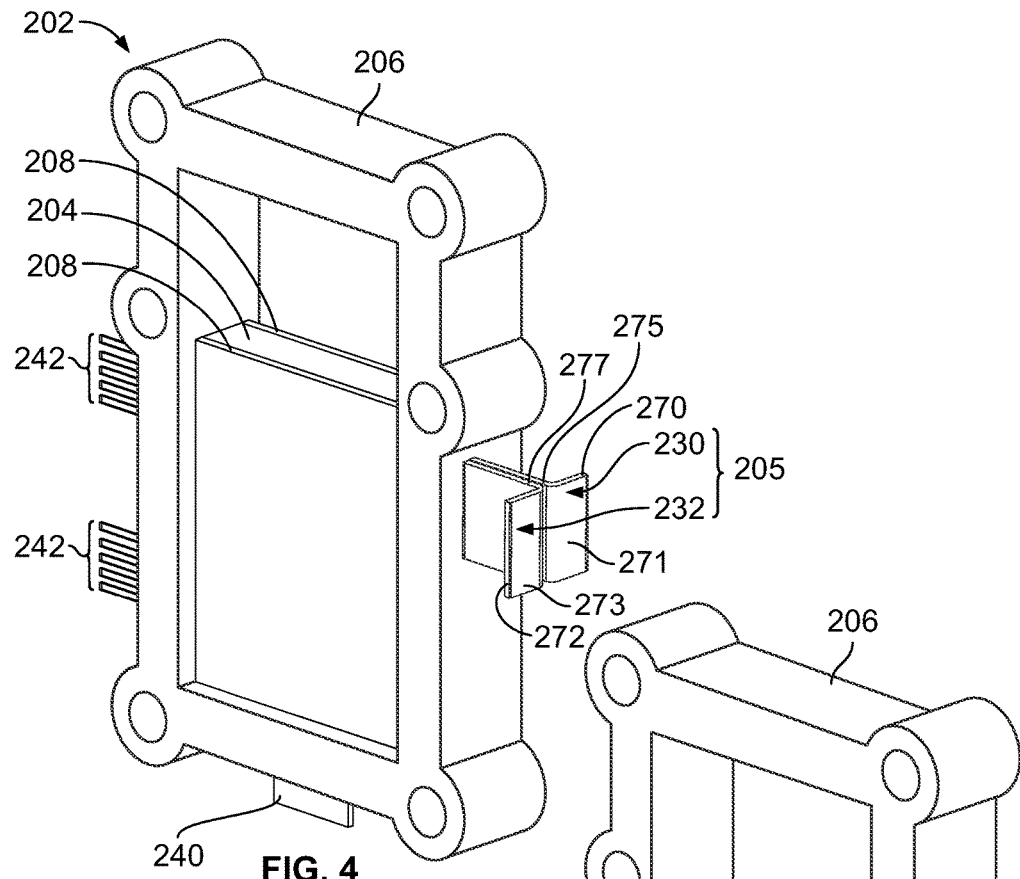
FIG. 4 is a perspective view of the portion of the power module assembly of FIG. 3.
Figure 5A:
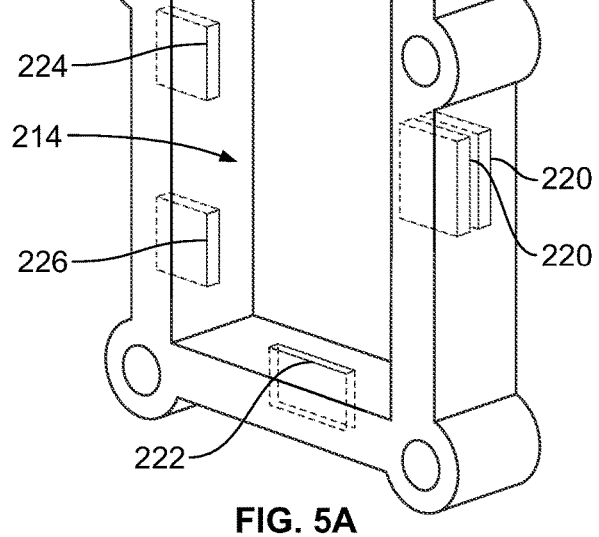
FIG. 5A is a perspective view of a frame of the power module of FIG. 4.
Figure 5B:
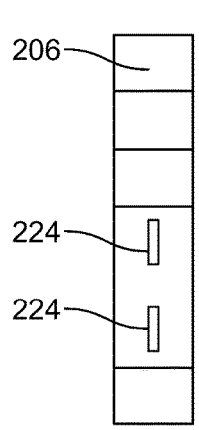
FIG. 5B is a side view of the frame of FIG. 5A.
Figure 5C:
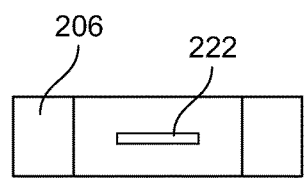
FIG. 5C is a bottom view of the frame of the power module of FIG. 4.
Figure 5D:
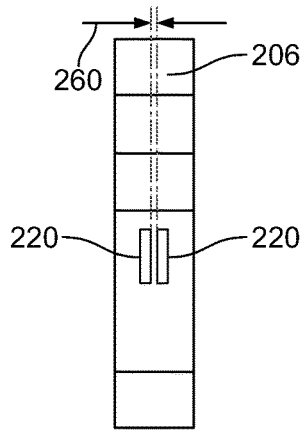
FIG. 5D is another side view of the frame of FIG. 5A.

FIGS. 3 and 4 show an example of a portion of a power module assembly for use with an electrified vehicle, referred to generally as a power module assembly 200 herein. The power module assembly 200 may include a plurality of power modules stacked in an array. FIG. 4 shows an example of a power module of the plurality of power modules, referred to generally as a power module 202 herein. Each power module 202 of the power modules assembly 200 may include a power stage 204 retained by a frame 206. The power stage 204 may be adjacent to one or more thermal plates, such as thermal plates 208, and may include a DC terminal 205. A pair of endplates 207 may retain the power modules 202 therebetween. The thermal plates 208 may be in thermal communication with adjacent power stages 204 of the plurality of power modules. The frame 206 may orient the thermal plates 208 in a location proximate to the power stages 204 to provide a flow path for coolant to assist in managing thermal conditions of the power stages 204. One of the endplates 207 may include an inlet 210 and an outlet 212 to assist in delivering and removing coolant from the thermal plates 208. It is contemplated that other configurations are available for the locations of the inlet 210 and the outlet 212.

Each frame 206 may define a power stage cavity 214 to receive one of the power stages 204. Each frame 206 may define a plurality of apertures or slots sized to receive components of the power stage 204. FIGS. 5A through 5D show examples of locations for the apertures or slots. For example, each frame 206 may define a pair of DC slots 220, an AC slot 222, a first signal pin slot 224, and a second signal pin slot 226. The slots may be located on different sides of the frame 206. The AC slot 222 may be sized to receive an AC leadframe. The first signal pin slot 224 and the second signal pin slot 226 may each be sized to receive one or more signal pins. The DC slots 220 may be spaced apart from one another and sized to receive DC leadframes of the DC terminal 205.

Figure 6:
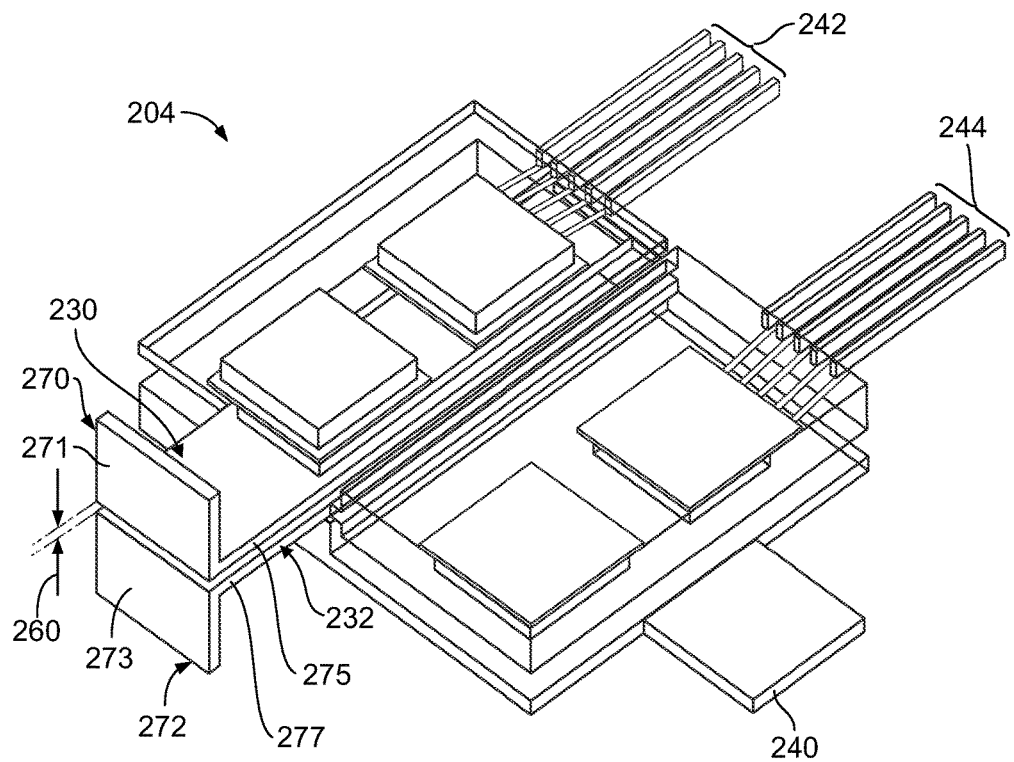
FIG. 6 is a perspective view of a power stage of the power module of FIG. 4.
Figure 7:
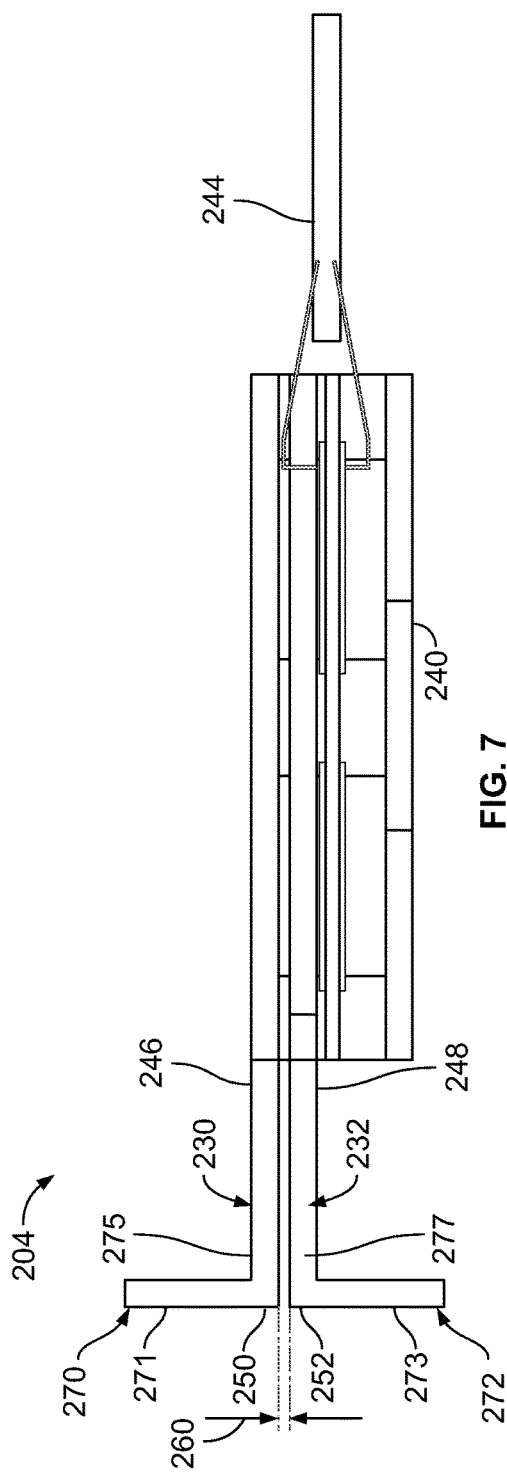
FIG. 7 is a bottom view of the power stage of FIG. 6.
Figure 8:
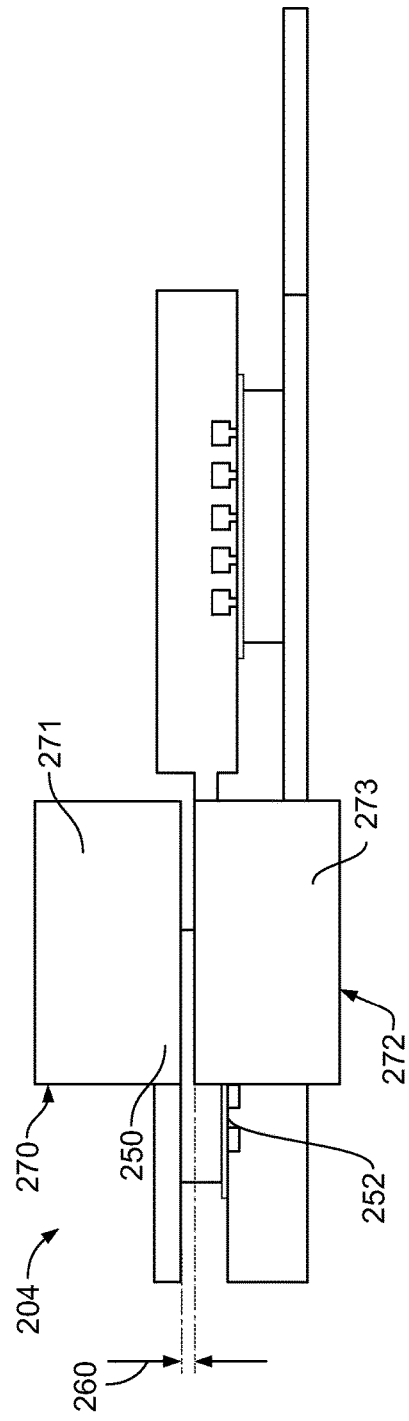
FIG. 8 is a side view of the power stage of FIG. 6.

For example and now additionally referring to FIGS. 6 through 8, each DC terminal 205 may include a pair of DC leadframes, referred to as a first DC leadframe 230 and a second DC leadframe 232. The first DC leadframe 230 and the second DC leadframe 232 may be of opposite polarities and may be electrically connected to receiving connectors (not shown) of a capacitor module 234 (the capacitor module 234 is shown partially transparent in FIG. 1 to provide a view to components of the power module assembly 200). Each power stage 204 may include an AC leadframe 240, a first set of signal pins 242, and a second set of signal pins 244. The AC leadframe 240 may be electrically connected to an electric machine, such as the electric machines described above. The first set of signal pins 242 and the second set of signal pins 244 may be electrically connected to a gate drive board 245 (shown in FIG. 1).

The first DC leadframe 230 and the second DC leadframe 232 may extend from the power stage 204 and be spaced apart in a stacked configuration. For example, the first DC leadframe 230 may extend through one of the DC slots 220 of the frame 206 and the second DC leadframe 232 may extend through the other of the DC slots 220. It is also contemplated that the frame 206 may define a single slot or opening to receive both the first DC leadframe 230 and the second DC leadframe 232 instead of two separate slots. The first DC leadframe 230 and the second DC leadframe 232 may extend in parallel to one another from the power stage 204 and such that a proximal end 246 of the first DC leadframe 230 is spaced apart from a proximal end 248 of the second DC leadframe 232 at a distance equal to a spacing between a distal end 250 of the first DC leadframe 230 and a distal end 252 of the second DC leadframe 232.

For example, the first DC leadframe 230 and the second DC leadframe 232 may be spaced apart at a distance 260.

The distance 260 may be based on characteristics/materials of the components of the power stage 204 and also on a preselected amount of current which will flow therethrough in order to minimize stray inductance. For example, the first DC leadframe 230 and the second DC leadframe 232 may be spaced apart from one another within a range of 0.1 millimeters to 20.0 millimeters.

The spacing between the first DC leadframe 230 and the second DC leadframe 232 may assist in reducing stray inductance which may result when current is flowing through the leadframes. For example, a change in current or a current spike in a circuit may induce a voltage or electrical field which may negatively affect the leadframes or conductors nearby. Spacing the first DC leadframe 230 and the second DC leadframe 232 apart from one another at the distance 260 may reduce stray inductance in comparison to other DC leadframe configurations such as a side-by-side configuration similar to a relationship shown in FIG. 6 between the first set of signal pins 242 and the second set of signal pins 244. The DC slots 220 may also be spaced apart corresponding to the distance 260 to assist in promoting the parallel relationship between the DC leadframes which may assist in promoting a cancellation of mutual inductance from the DC leadframes to allow low voltage spikes during switching events.

The first DC leadframe 230 may include a first tab 270 extending from the distal end 250. The second DC leadframe 232 may include a second tab 272 extending from the distal end 252. The first tab 270 and the second tab 272 may be configured to electrically connect to a capacitor module, such as the capacitor module 234, and may extend in opposite directions from one another. The first tab 270 defines an outer surface 271. The second tab 272 defines an outer surface 273. The outer surface 271 and the outer surface 273 may define planes coplanar or substantially coplanar to one another. The first DC leadframe 230 may include opposing side surfaces 275 defining planes parallel to one another. The second DC leadframe 232 may include opposing side surfaces 277 defining planes parallel to the planes defined by the side surfaces 275 of the first DC leadframe 230 such that the corresponding side surfaces are coplanar.

While exemplary embodiments are described above, it is not intended that these embodiments describe all possible forms encompassed by the claims. The words used in the specification are words of description rather than limitation, and it is understood that various changes can be made without departing from the spirit and scope of the disclosure. As previously described, the features of various embodiments can be combined to form further embodiments of the disclosure that may not be explicitly described or illustrated. While various embodiments could have been described as providing advantages or being preferred over other embodiments or prior art implementations with respect to one or more desired characteristics, those of ordinary skill in the art recognize that one or more features or characteristics can be compromised to achieve desired overall system attributes, which depend on the specific application and implementation. These attributes can include, but are not limited to cost, strength, durability, life cycle cost, marketability, appearance, packaging, size, serviceability, weight, manufacturability, ease of assembly, etc. As such, embodiments described as less desirable than other embodiments or prior art implementations with respect to one or more characteristics are not outside the scope of the disclosure and can be desirable for particular applications.

What is claimed is:

1. A vehicle power stage assembly comprising:
   a power stage housing including a first slot and a second slot;
   a power stage supported by the housing; and
   a pair of stacked DC leadframes of opposite polarity spaced apart from one another, each extending from the power stage through one of the first slot and the second slot, and each having distal and proximal ends,
   wherein the spacing between the leadframes is such that parasitic inductances associated with current flowing through each of the leadframes at least partially cancel one another.

2. The assembly of claim 1, wherein each of the leadframes further defines a connector tab configured to electrically connect to a capacitor module and wherein the leadframes are arranged such that the connector tabs extend in opposite directions from one another and outer surfaces of the tabs are substantially coplanar.

3. The assembly of claim 1, wherein the leadframes are spaced apart a distance falling within a range of 0.25 millimeters to 1.0 millimeters.

4. The assembly of claim 1, wherein each of the leadframes defines a first and second side surface opposite one another and wherein the first side surfaces are coplanar and the second side surfaces are coplanar.

5. The assembly of claim 1, wherein the leadframes are oriented parallel to one another.

6. The assembly of claim 1, wherein a distance between the spaced apart pair of DC leadframes is based on a preselected amount of current and a material of the DC leadframes.

7. A vehicle power module assembly comprising:
   a frame defining a stage cavity and a first slot open to the cavity; and
   a power stage disposed within the cavity and having a pair of DC leadframes extending through the first slot, wherein the first slot is defined such that distal and proximal ends of one of the leadframes are equally spaced apart relative to corresponding distal and proximal ends of the other of the leadframes.

8. The assembly of claim 7, wherein the frame further defines a second slot open to the cavity and wherein the power stage further has an AC leadframe extending through the second slot.

9. The assembly of claim 8, wherein the frame further defines a signal pin slot open to the cavity, wherein the power stage further has at least one set of signal pins extending through the signal pin slot, and wherein the slots are arranged relative to one another such that the DC leadframes and pins each extend from a different side of the power stage.

10. The assembly of claim 7, wherein the DC leadframes are spaced apart a distance such that parasitic inductances associated with current flowing through each of the leadframes at least partially cancel one another.

11. The assembly of claim 7, wherein the DC leadframes are spaced apart a distance falling within a range of 0.1 millimeters to 20.0 millimeters.

12. The assembly of claim 7, further comprising a capacitor module having a pair of DC leadframe receiving connectors and arranged with the frame such that the connectors are spaced apart from one another at a distance equal to the spacing between the DC leadframes.

13. A vehicle power module assembly comprising:
   a frame defining a cavity and first and second DC slots spaced apart from one another; and a power stage disposed within the cavity and having a pair of DC leadframes of opposite polarity, one of the DC leadframes extending through one of the slots and the other of the DC leadframes extending through the other of the slots, wherein the stage and slots are arranged with one another to position proximal and distal ends of one of the DC leadframes at equal spacings from proximal and distal ends of the other of the DC leadframes.

14. The assembly of claim 13, wherein each of the DC leadframes further has a tab extending from the distal end and away from other of the tabs, and wherein outer surfaces defined by each of the tabs are coplanar.

15. The assembly of claim 13, wherein the DC leadframes are spaced to reduce stray inductances associated with the DC leadframes.

16. The assembly of claim 13, wherein the frame further defines an AC slot arranged with the power stage such that the AC slot is on a side of the frame which does not include the DC slots.

17. The assembly of claim 16, wherein the frame further defines a pair of signal pin slots arranged with the power stage such that the signal pin slots are on a side of the frame which does not include the DC slots or the AC slot.

* * * * *